(12) United States Patent
Murano et al.

(10) Patent No.: US 10,350,679 B2
(45) Date of Patent: Jul. 16, 2019

(54) FINE SILVER PARTICLE DISPERSING SOLUTION

(71) Applicant: Dowa Electronics Materials Co., Ltd., Tokyo (JP)

(72) Inventors: Yu Murano, Tokyo (JP); Hidefumi Fujita, Okayama (JP); Daisuke Itoh, Okayama (JP); Shuji Yamashita, Okayama (JP); Daiki Yoshihara, Okayama (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 31 days.

(21) Appl. No.: 15/126,062

(22) PCT Filed: May 12, 2015

(86) PCT No.: PCT/JP2015/064125
§ 371 (c)(1),
(2) Date: Sep. 14, 2016

(87) PCT Pub. No.: WO2015/178326
PCT Pub. Date: Nov. 26, 2015

(65) Prior Publication Data
US 2017/0087633 A1    Mar. 30, 2017

(30) Foreign Application Priority Data

May 19, 2014   (JP) .................................. 2014-102981

(51) Int. Cl.
*B22F 1/00*     (2006.01)
*C09D 7/65*     (2018.01)
(Continued)

(52) U.S. Cl.
CPC .......... *B22F 1/0022* (2013.01); *B22F 1/0018* (2013.01); *B22F 1/0062* (2013.01);
(Continued)

(58) Field of Classification Search
CPC ........ B22F 1/0022; B22F 1/0062; B22F 1/02; B22F 9/24; B22F 2009/245;
(Continued)

(56) References Cited

U.S. PATENT DOCUMENTS

| 2011/0183068 | A1* | 7/2011 | Yamakawa | ............... | B22F 9/24 |
| | | | | | 427/125 |
| 2012/0177897 | A1* | 7/2012 | Jablonski | .............. | B22F 1/0022 |
| | | | | | 428/208 |
| 2013/0277300 | A1 | 10/2013 | Nunes et al. | | |

FOREIGN PATENT DOCUMENTS

| EP | 2339594 A1 | 6/2011 |
| EP | 2610023 A1 | 7/2013 |

(Continued)

OTHER PUBLICATIONS

International search report for Apln. No. PCT/JP2015/064125 dated Aug. 10, 2015.
(Continued)

*Primary Examiner* — Harold Y Pyon
*Assistant Examiner* — Danny N Kang
(74) *Attorney, Agent, or Firm* — Bachman & LaPointe, PC

(57) ABSTRACT

In a fine silver particle dispersing solution wherein 30 to 75% by weight of fine silver particles, which are coated with an organic acid having a carbon number of 5 to 8 or a derivative thereof and which have an average particle diameter of 1 to 100 nm, are dispersed in a water-based dispersion medium which is a solvent containing water as a main component, the fine silver particle dispersing solution containing ammonia and nitric acid, there is added 0.15 to 0.6% by weight of a surface regulating agent, which preferably contains a polyether-modified polydimethylsiloxane and a polyoxyethylene alkyl ether or a polyether, or 0.005 to 0.6%
(Continued)

by weight of an antifoaming agent which is preferably a silicone antifoaming agent.

20 Claims, 2 Drawing Sheets

(51) Int. Cl.
| | |
|---|---|
| C08K 3/08 | (2006.01) |
| H01B 1/02 | (2006.01) |
| B22F 1/02 | (2006.01) |
| B22F 9/24 | (2006.01) |
| H01B 1/22 | (2006.01) |
| C09D 5/24 | (2006.01) |
| C09D 11/03 | (2014.01) |
| C09D 11/033 | (2014.01) |
| C09D 11/037 | (2014.01) |
| C09D 11/52 | (2014.01) |
| H05K 1/09 | (2006.01) |

(52) U.S. Cl.
CPC ............... *B22F 1/02* (2013.01); *B22F 9/24* (2013.01); *C09D 5/24* (2013.01); *C09D 7/65* (2018.01); *C09D 11/03* (2013.01); *C09D 11/033* (2013.01); *C09D 11/037* (2013.01); *C09D 11/52* (2013.01); *H01B 1/02* (2013.01); *H01B 1/22* (2013.01); *H05K 1/097* (2013.01); *B22F 2009/245* (2013.01); *B22F 2301/255* (2013.01); *B22F 2302/45* (2013.01); *B22F 2303/01* (2013.01); *B22F 2304/054* (2013.01); *B22F 2998/10* (2013.01)

(58) Field of Classification Search
CPC ............ B22F 2301/255; B22F 2302/45; B22F 2303/01; B22F 2304/054; C09D 5/24; C09D 7/125; H01B 1/22
USPC ....................................................... 252/500
See application file for complete search history.

(56) References Cited

FOREIGN PATENT DOCUMENTS

| | | |
|---|---|---|
| JP | 2009120949 | 6/2009 |
| JP | 2010121206 | 6/2010 |
| JP | 2013241507 | 5/2013 |
| JP | 2014047413 | 3/2014 |
| JP | 2014047413 A * | 3/2014 |
| WO | 2012/026033 | 10/2013 |

OTHER PUBLICATIONS

European search report for patent application No. 15796825.6 dated Nov. 15, 2017.

* cited by examiner

FINE SILVER PARTICLE DISPERSING SOLUTION

TECHNICAL FIELD

The present invention relates generally to a fine silver particle dispersing solution. More specifically, the invention relates to a fine silver particle dispersing solution used for forming conductive circuits of electronic parts, such as RFID antennas, and so forth.

BACKGROUND ART

Conventionally, wires and conductive circuits of electronic parts, such as RFID antennas, required to have high reliability, are formed by sputtering an expensive noble metal on a masked substrate. However, in a method for forming wires and conductive circuits by sputtering, it is required to carry out various processes, so that the productivity thereof is not high. In addition, a part of the expensive noble metal input as a raw material is not used for forming the wires and conductive circuits, so that it has been studied to form wires and conductive circuits by other methods from the point of view of the effective use of resources.

In recent years, as a method for easily mass-producing wires and conductive circuits of electronic parts, there are noticed printed electronics for applying a print technique to form wires and conductive circuits, and it has been studied that a conductive ink containing metal particles dispersed in a dispersion medium is printed on a substrate by any one of various print techniques, such as flexographic printing and screen printing, to sinter the metal particles with each other to form wires, conductive circuits or the like.

On the other hand, when the particle diameter of the metal particles is about a few nanometers to about tens nanometers, the surface area of the metal particles is very large, so that the melting point thereof is dramatically lowered. For that reason, as compared with a case where a conductive ink containing metal particles having a particle diameter of about a few micrometers dispersed in a dispersion medium is used for forming wires or conductive circuits, it is not only possible to form fine wires or conductive circuits, but it is also possible to sinter metal particles with each other even if they are burned at a low temperature of not higher than 200° C. Therefore, it is possible to use various substrates, such as a substrate having a low heat resisting property. For that reason, it is expected that a conductive ink (a fine metal particle dispersing solution) containing fine metal particles (metal nanoparticles) having a particle diameter of not greater than tens nanometers is applied to printed electronics to form fine wires or conductive circuits of electronic parts.

Fine metal particles having a particle diameter of not greater than tens nanometers have a very high activation. Such fine metal particles are unstable as they are. For that reason, in order to ensure the independence and preservation stability of the fine metal particles by preventing the fine metal particles from being sintered and/or aggregated with each other, there is proposed a conductive ink (a fine metal particle dispersing solution) wherein fine metal particles coated with an organic matter, such as a surfactant having a long chain, are dispersed in an organic solvent, such as decane or terpineol. However, if fine metal particles are coated with a surfactant having a high molecular weight and a long chain, the boiling point and decomposition point thereof are high. For that reason, when the fine metal particles are sintered with each other to form wires, conductive circuits or the like, it is required to treat the fine metal particles at a high temperature in order to remove and decompose the surfactant on the surface of the fine metal particles, so that it is not possible to use a substrate having a low heat-resistance. In addition, it is required to carry out the heat treatment for a relatively long time of about 30 minutes to about 1 hour, so that the productivity thereof is deteriorated. Moreover, if an organic solvent is used as the dispersing medium of the conductive ink, it may cause the pollution of the environment unless it is carefully disposed. In addition, when the organic solvent is heated or allowed to stand in an open system, evaporated organic components diffuse to the environment, so that it is required to install a local exhaust ventilation or the like when a large amount of organic solvent is treated. Therefore, if it is possible to use a dispersing medium containing no organic solvent as a main component, it is desired in terms of environment and work.

For that reason, there is proposed a silver nanoparticle composition wherein silver nanoparticles protected with an organic acid or a derivative thereof are dispersed in a solvent containing water as a main component (see, e.g., International Publication No. 2012/026033). If this silver nanoparticle composition is used as a conductive ink, even if a heat treatment is carried out at a low temperature for a short period of time, it is possible to sinter the silver nanoparticles with each other to form good wires, conductive circuits or the like on a substrate.

However, if the metal nanoparticles composition disclosed in International Publication No. 2012/026033 is used as a conductive ink to be printed on a substrate in the shape of a complicated wiring design by means of a continuous roll-to-roll flexographic printing machine which is industrially used in general, there is a problem in that a thin web-shaped film is formed between adjacent wiring portions facing each other, so that a short circuit of a wire formed by heat treatment is easily caused. It is considered that such a thin film is caused by a reaction product of the organic acid or derivative thereof and ammonia (added for adjusting pH during the synthesis of silver nanoparticles and/or after the reaction) in the silver nanoparticle composition disclosed in International Publication No. 2012/026033.

It is possible to prevent the formation of such a thin film by using a low-volume anilox roll. However, if the low-volume anilox roll is used, there is a problem in that the transfer ratio of the conductive ink is deteriorated, so that the thickness of a wire formed by heat treatment is decreased to increase the resistance thereof.

DISCLOSURE OF THE INVENTION

It is therefore an object of the present invention to eliminate the aforementioned problems and to provide a fine silver particle dispersing solution, which is able to be printed on a substrate in a desired wiring shape by flexographic printing and which is able to prevent the deterioration of the resistance of a wire formed on the substrate by heat treatment.

In order to accomplish the aforementioned and other objects, the inventors have diligently studied and found that it is possible to provide a fine silver particle dispersing solution, which is able to be printed in a desired wiring shape by flexographic printing and which is able to prevent the deterioration of the resistance of a wire formed on the substrate by heat treatment, if a shape retaining agent is added to a fine silver particle dispersing solution wherein fine silver particles coated with an organic acid or a derivative thereof are dispersed in a water-based dispersion medium and which contains ammonia and nitric acid. Thus, the inventors have made the present invention.

According to the present invention, there is provided a fine silver particle dispersing solution comprising: a water-based dispersion medium; fine silver particles dispersed in the water-based dispersion medium, the fine silver particles being coated with an organic acid or a derivative thereof; ammonia added to the water-based dispersion medium; nitric acid added to the water-based dispersion medium; and a shape retaining agent added to the water-based dispersion medium.

In this fine silver particle dispersing solution, the shape retaining agent is preferably a surface regulating agent which preferably has a content of 0.15 to 0.6% by weight in the fine silver particle dispersing solution. The surface regulating agent preferably contains a polyether-modified polydimethylsiloxane and a polyoxyethylene alkyl ether or a polyether. The shape retaining agent may be an antifoaming agent which preferably has a content of 0.005 to 0.6% by weight in the fine silver particle dispersing solution. The antifoaming agent is preferably a silicone antifoaming agent.

The concentration of ammonia in the fine silver particle dispersing solution is preferably 0.1 to 2.0% by weight, and the concentration of nitric acid in the fine silver particle dispersing solution is preferably 0.1 to 6.0% by weight. The pH of the fine silver particle dispersing solution is preferably 5.3 to 8.0, and the water-based dispersion medium is preferably a solvent containing 50% by weight or more of water. The content of the fine silver particles in the fine silver particle dispersing solution is preferably 30 to 75% by weight. The average particle diameter of the fine silver particles is preferably 1 to 100 nm. The organic acid is preferably a carboxylic acid having a carbon number of 5 to 8. The amount of the organic acid or derivative thereof is preferably 2 to 20% by weight with respect to silver in the fine silver particle dispersing solution. The fine silver particle dispersing solution preferably has a lamella length having an average value of 4.6 mm or less.

Throughout the specification, the expression "average particle diameter of fine silver particles" means the average primary particle diameter which is an average value of primary particle diameters of fine silver particles based on a transmission electron microphotograph (TEM image).

The expression "lamella length" is an index indicating the spread of a liquid film. When a ring (a lamella length probe) is vertically pulled up from a liquid after it is dipped in the liquid, the pulling-up distance of the ring can be measured as the lamella length, the pulling-up distance being a distance by which the ring is pulled up until a liquid film formed between the ring and the surface of the liquid is broken after the force applied to the ring by the liquid film is maximum. Throughout the specification, the expression "average value of lamella length" means an average value of six measured values of lamella length when the lamella length is measured by means of an automatic surface tension balance using a platinum ring having a wire diameter of 0.40 mm and a ring diameter of 14.4 mm as a lamella length probe, at a stage vertical speed of 1.0 mm/sec, a pre-wet stage vertical speed of 1.0 mm/sec and a pre-wet dipping distance of 2.50 mm for a pre-wet dipping time of 5 seconds.

According to the present invention, it is possible to provide a fine silver particle dispersing solution, which is able to be printed on a substrate in a desired wiring shape by flexographic printing and which is able to prevent the deterioration of the resistance of a wire formed on the substrate by heat treatment.

BEST MODE FOR CARRYING OUT THE INVENTION

Figure 1A:
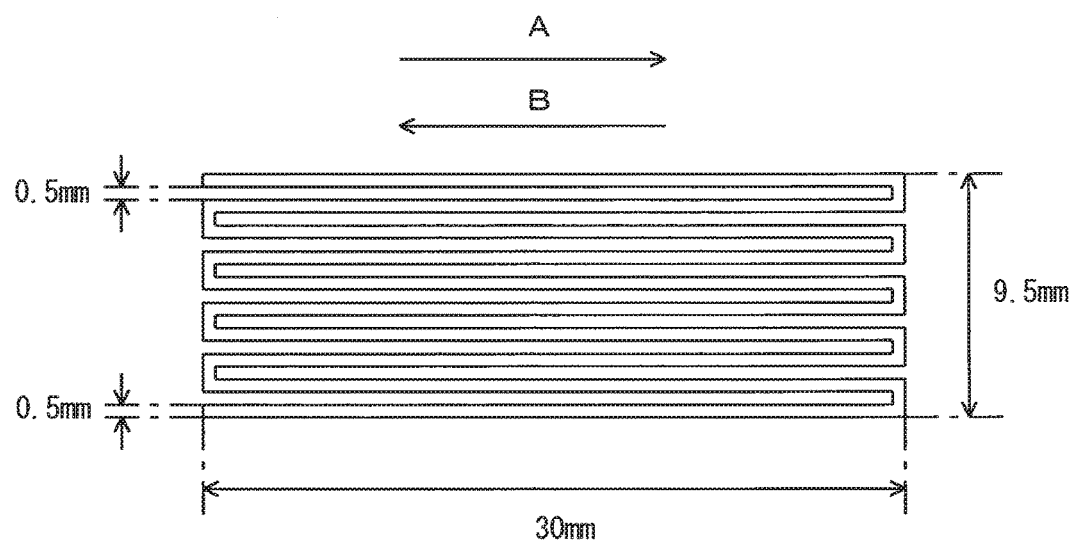
FIG. 1A is a plan view showing the shape and size of a coating film formed for measuring the length of a thin web-shaped film of a fine silver particle dispersing solution.

The preferred embodiment of a fine silver particle dispersing solution according to the present invention, contains: fine silver particles, which are coated with an organic acid or a derivative thereof and which are dispersed in a water-based dispersion medium; ammonia; nitric acid; and a shape retaining agent.

The water-based dispersion medium is a solvent containing water as a main component. The waver-based medium is a solvent which preferably contains 50% by weight or more of water and more preferably contains 75% by weight or more of water. In order to adjust the viscosity of the water-based dispersion medium, there may be added 10% by weight or less of a thickener, such as a polyurethane thickener, with respect to the fine silver particle dispersing solution. In order to ensure wattability, there may be added 10% by weight or less of an organic solvent, such as a polypropylene glycol. In order to improve the adhesion of the water-based dispersion medium to a substrate, there may be added a water soluble dispersion resin wherein a polymer is stably suspended and dispersed in water. As this water soluble dispersion resin, there may be used a water soluble latex, such as a polyvinyl chloride. The amount of the water soluble dispersion resin to be added is preferably 0.5 to 8% by weight, and more preferably 1 to 7% by weight. If the amount of the water soluble dispersion resin is less than 0.5% by weight, it is not possible to sufficiently improve the adhesion of the water-based dispersion medium to the substrate. If the amount of the water soluble dispersion resin is larger than 8% by weight, there is caused the deterioration of the dispersibility of the resin, such as the production of aggregates in the fine silver particle dispersing solution, so that there is a bad influence on the electrical conductivity of a coating film to be formed. Thus, it is not preferable to allow the amount of the water soluble dispersion resin to be less than 0.5% by weight and larger than 8% by weight.

As the shape retaining agent, there is preferably used a surface regulating agent or an antifoaming agent. The surface regulating agent is preferably a water-insoluble surface regulating agent. When the surface regulating agent (preferably the water-insoluble surface regulating agent) or the antifoaming agent is added to the fine silver particle dispersing solution, even if the fine silver particle dispersing solution is printed on a substrate in the shape of a complicated wiring design, it is possible to inhibit the formation of a thin web-shaped film between adjacent wiring portions facing each other, so that it is possible to prevent a short circuit of a wire formed by heat treatment. It is also possible to defoam on the surface of the coating film to cause the thickness of the coating film to be uniform when there is defoamed in the fine silver particle dispersing solution and/or when the fine silver particle dispersing solution is applied to the substrate to form the coating film. When the surface regulating agent is used as the shape retaining agent, the content of the surface regulating agent in the fine silver particle dispersing solution is preferably 0.15 to 0.6% by weight, and more preferably 0.2 to 0.5% by weight. When the antifoaming agent is used as the shape retaining agent, the content of the antifoaming agent in the fine silver particle dispersing solution is preferably 0.005 to 0.6% by weight, and more preferably 0.01 to 0.3% by weight.

The surface regulating agent preferably contains a polyether-modified polydimethylsiloxane and a polyoxyethylene alkyl ether or a polyether. As the surface regulating agent containing the polyether-modified polydimethylsiloxane and the polyoxyethylene alkyl ether, there may be used a surface regulating agent (BYK302 commercially available from BYK Limited) containing 95% by weight or more of non-volatile components, having a middle surface-tension deteriorating ability, and containing 43% by weight of a polyether-modified polydimethylsiloxane and 57% by weight of a polyoxyethylene alkyl ether. As the surface regulating agent containing the polyether-modified polydimethylsiloxane and the polyether, there may be used a surface regulating agent (BYK331 commercially available from BYK Limited) containing 98% by weight or more of non-volatile components, having a middle surface-tension deteriorating ability, and comprising a mixture of a polyether-modified polydimethylsiloxane and a polyether, or there may be used a surface regulating agent (BYK333 commercially available from BYK Limited) containing 97% by weight or more of non-volatile components, having a high surface-tension deteriorating ability, and comprising a mixture of a polyether-modified polydimethylsiloxane and a polyether.

As the antifoaming agent, there is preferably used a silicone antifoaming agent. As the silicone antifoaming agent, there may be used KM-7750 (active ingredient: 38%) or KM-90 (active ingredient: 53%) commercially available from Shin-Etsu Chemical Co., Ltd.

The concentration of ammonia in the fine silver particle dispersing solution is preferably 0.1 to 2.0% by weight, and more preferably 0.2 to 1.5% by weight. If the concentration of ammonia is less than 0.1% by weight, the size of the secondary aggregates of the fine silver particles in the fine silver particle dispersing solution is increased to cause the fine silver particles to violently settle to deteriorate the electrical conductivity of a silver conductive film formed by burning the fine silver particle dispersing solution applied on the substrate. On the other hand, if the concentration of ammonia exceeds 2.0% by weight, the ionic strength is too high, so that the fine silver particles are violently agglutinated.

The concentration of nitric acid in the fine silver particle dispersing solution is preferably 0.1 to 6.0% by weight, and more preferably 0.3 to 5.0% by weight. If the concentration of nitric acid is less than 0.1% by weight, when the coating film formed by applying the fine silver particle dispersing solution on the substrate is burned to form a silver conductive film, it is not possible to promote the decomposition of the resins or the like added to the fine silver particle dispersing solution, so that the low-temperature sinterability thereof is deteriorated. On the other hand, if the concentration of nitric acid exceeds 6.0% by weight, the ionic strength is too high, so that the fine silver particles are violently agglutinated.

The fine silver particles may have an average particle diameter of 1 to 100 nm, preferably 1 to 50 nm, more preferably 1 to 30 nm, and most preferably 1 to 20 nm. If the average particle size is larger than 100 nm, it is difficult to obtain the low-temperature sinterability expected as the fine silver particles. The content of the fine silver particles in the fine silver particle dispersing solution is preferably 30 to 75% by weight, and more preferably 55 to 75% by weight. If the content of the fine silver particles in the fine silver particle dispersing solution is too low, the electrical conductivity of wires and conductive circuits formed by using the fine silver particle dispersing solution is deteriorated. If the content of the fine silver particles in the fine silver particle dispersing solution is too high, the viscosity of the fine silver particle dispersing solution is too high, so that it is not possible to suitably print the fine silver particle dispersing solution on the substrate.

The surface of each of the fine silver particles is preferably coated with an organic acid or a derivative thereof, such as a carboxylic acid having a carbon number of 5 to 8 (e.g., heptanoic acid). By coating the fine silver particles with such an organic acid or derivative thereof, it is possible to prevent the sintering of the fine silver particles with each other to suitably hold the distance between the adjacent two of the fine silver particles. If the carbon number is greater than 8, it is required to provide a high thermal energy during the thermal decomposition thereof. On the other hand, if the carbon number is less than 3, it is not possible to suitably hold the distance between the adjacent two of the fine silver particles.

The pH of the fine silver particle dispersing solution is preferably 5.3 to 8.0. If the pH is lower than 5.3, the organic acid or derivative thereof in the fine silver particle dispersing solution is hardly dissolved, so that it is not possible to cause the excessive organic acid or derivative thereof to dissociate from the surface of the fine silver particles. If the pH is higher than 8.0, the solubility of the organic acid or derivative thereof in the fine silver particle dispersing solution is too high, so that the fine silver particles are agglutinated with each other since it is not possible to coat the fine silver particles with a sufficient amount of the organic acid or derivative thereof in order to disperse the fine silver particles to each other.

The viscosity of the fine silver particle dispersing solution is preferably 10,000 mPa·s or less at 11.1 (1/s), 2,000 mPa·s or less at 108 (1/s) and 500 mPa·s or less at 1000 (1/s), respectively, at a temperature of 25° C. If the viscosity of the fine silver particle dispersing solution is too high, when the fine silver particle dispersing solution is applied on the substrate, the surface of the coating film is rough. In addition, if the viscosity of the fine silver particle dispersing solution is too high, when the fine silver particle dispersing solution is sequentially printed on the substrate, it is difficult to supply the fine silver particle, so that it is not possible to suitably print the solution.

The amount of the organic acid or derivative thereof with respect to silver in the fine silver particle dispersing solution is preferably 2 to 20% by weight. If the amount is less than 2% by weight, the function of coating and protecting the fine silver particles is remarkably weakened to produce the aggregates of the fine silver particles, so that the low-temperature sinterability thereof is deteriorated. On the other hand, if the amount exceeds 20% by weight, it is not possible to sinter the fine silver particles at a low temperature in a short period of time since the boiling point of the organic acid or derivative thereof is higher than that of water.

Furthermore, the average particle diameter (average primary particle diameter) of the fine silver particles can be calculated as follows. For example, 2 parts by weight of a water-based Ag ink containing fine silver particles, such as a water-based Ag ink which contains 60% by weight of Ag particles, 3.0% by weight of a polyvinyl chloride copolymer latex, 2.0% by weight of a polyurethane thickener and 2.5% by weight of a polypropylene glycol, is added to a mixed solution of 96 parts by weight of cyclohexane and 2 parts by weight of oleic acid, to be dispersed by ultrasonic. Then, the dispersing solution thus obtained is allowed to drop onto a Cu microgrid having a supporting film to be dried. Then, an image obtained by observing the fine silver particles on the microgrid in a bright field at an accelerating voltage of 100 kV by means of a transmission electron microscope (JEM-100 CX Mark-II produced by Japan Electron Optics Laboratory Ltd.) is taken at a magnification of 300,000. From the TEM image thus obtained, the average primary particle diameter of the fine silver particles can be calculated. The calculation of the average primary particle diameter of the fine silver particles can be carried out by, e.g., an image analysis software (A-image-kun (registered trademark) produced by Asahi Kasei Engineering Corporation). This image analysis software is designed to identify and analyze each of particles with the gradation of color. For example, with respect to the TEM image having the magnification of 300,000, a circular particle analysis is carried out on such conditions that "the brightness of particles" is set to be "dark", "the noise removing filter" is used, "the circular threshold value" is set to be "20", and "the overlapping degree" is set to be "50". Thus, the primary particle diameters of 200 or more of particles are measured, and the number average diameter thereof can be obtained as the average primary particle diameter. If the TEM image has a large number of sintered particles and deformed particles, it may be determined as impossible measurement (no measured).

When the lamella length of the fine silver particle dispersing solution is measured by means of an automatic surface tension balance using a platinum ring, which has a wire diameter of 0.40 mm and a ring diameter of 14.4 mm, as a lamella length probe, at a stage vertical speed of 1.0 mm/sec, a pre-wet stage vertical speed of 1.0 mm/sec and a pre-wet dipping distance of 2.50 mm for a pre-wet dipping time of 5 seconds, the average value of six measured values is preferably 4.6 mm or less. If the average value of lamella length is longer than 4.6 mm, when the fine silver particle dispersing solution is printed on a substrate in the shape of a complicated wiring design, a thin web-shaped film is formed between adjacent wiring portions facing each other, so that a short circuit of a wire formed by heat treatment is easily caused.

Figure 1B:
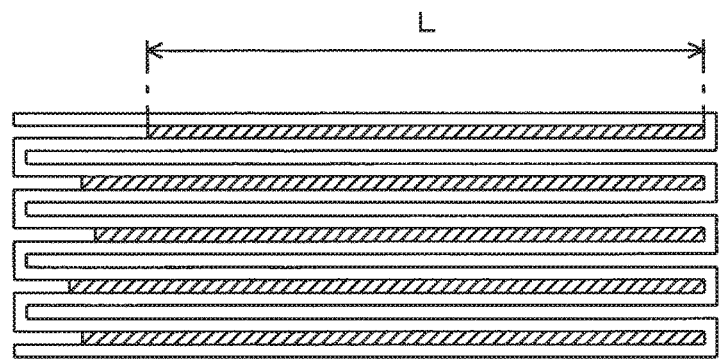
FIG. 1B is an illustration for explaining a method for measuring the length of the thin web-shaped film of the fine silver particle dispersing solution.

When the fine silver particle dispersing solution is applied on a substrate of a paper at a printing speed of 20 m/min (in a direction shown by arrow B) so as to form a coating film having the shape and size shown in FIG. 1A (a coating film which has a line width of 0.5 mm and which is turned at a space of 0.5 mm in width directions, in an area having a length of 30 mm×a width of 9.5 mm), the length L of the thin web-shaped film (of the fine silver particle dispersing solution) formed in shaded areas shown in FIG. 1B is preferably 10 mm or less.

Examples of a fine silver particle dispersing solution according to the present invention will be described below in detail.

Example 1

First, a starting solution A was prepared by mixing 0.31 kg of aqueous ammonia containing 28% by weight of ammonia, 0.36 kg of heptanoic acid and 1.2 kg of deionized water, and a starting solution B was prepared by diluting 0.39 kg of hydrous hydrazine containing 85% by weight of hydrazine with 1.0 kg of deionized water. Also, a starting solution C was prepared by dissolving 1.4 kg of silver nitrate crystal in 1.2 kg of heated deionized water.

Then, 11 kg of deionized water was put in a reaction vessel with a reflux condenser, and heated while being stirred. When the liquid temperature thereof was reached at a temperature of 30 to 50° C., the starting solutions A, B and C were sequentially added thereto while being stirred. Thus, the synthesis reaction for fine silver particles was started. The interior of the reaction vessel was cooled by a condenser tube installed in the reaction vessel so as not to cause the liquid temperature to be 60° C. or higher during the reaction. When the temperature rise was not caused by reaction heat even if the cooling of the reaction vessel was stopped, the reaction was terminated.

The reaction liquid obtained by this reaction (the liquid containing fine silver particles having heptanoic acid arranged around the particles) was transferred to another vessel to be allowed to stand for 24 hours, and then, a supernatant liquid was removed to concentrate the reaction liquid. After the concentrate thus obtained was put in an airtight bottle with lid to be allowed to stand for 3 months in a cool dark place, a supernatant liquid was suitably removed to obtain a further concentrated reaction liquid.

To the reaction liquid thus concentrated, aqueous ammonia was added to adjust the pH of the reaction liquid to be 6.0. Then, after the reaction liquid was allowed to stand for 3 days to cause excessive heptanoic acid to dissociate (from the surrounding portion of the fine silver particles), a supernatant liquid was removed to obtain a liquid containing the fine silver particles coated with heptanoic acid. Furthermore, the average particle diameter of the fine silver particles was 18 nm.

To the liquid containing the fine silver particles (coated with heptanoic acid) thus obtained, there were added and stirred a polyvinyl chloride copolymer latex (having a Tg of 73° C. as a high Tg polymer in order to enhance the adhesion of the liquid to a substrate when the liquid is applied on the substrate), a polyurethane thickener (for the adjustment of viscosity), a propylene glycol (as a humectant), and a supernatant liquid obtained after the above-described adjustment of pH (for adjusting the concentration of silver). Thus, there was obtained a conductive Ag ink containing 61% by weight of the fine silver particles, 3.0% by weight of the polyvinyl chloride copolymer latex (Tg=73° C.), 2.0% by weight of the polyurethane thickener and 2.5% by weight of the polypropylene glycol.

To 200 g of the conductive Ag ink, there were added 0.41 g (0.20% by weight with respect to the Ag ink) of a surface regulating agent (BYK302 commercially available from BYK Limited) (containing 95% by weight or more of non-volatile components and having a middle surface-tension deteriorating ability) comprising 43% by weight of a polyether-modified polydimethylsiloxane and 57% by weight of a polyoxyethylene alkyl ether, and 4.98 g of the supernatant liquid obtained before the above-described pH adjustment. Thus, there was obtained a fine silver particle dispersing solution having a concentration of Ag of 59.4% by weight.

The liquid-solid separation of the fine silver particle dispersing solution thus obtained was carried out by means of a membrane filter and an ultra-centrifugal separator, and the concentrations of ammonia and nitric acid in the liquid were measured by ion chromatography. As a result, the concentration of ammonia was 0.4% by weight, and the concentration of nitric acid was 1.0% by weight. After nitric acid was excessively added to the fine silver particle dispersing solution to be heated to completely dissolve the metal components therein, extraction was carried out four times with n-hexane. Thereafter, the quantity of the organic acid (heptanoic acid) was determined by a gas chromatography mass spectrometer (produced by Hewlett-Packard Company). As a result, the amount of heptanoic acid with respect to silver was 5% by weight. Furthermore, in Examples 2-12 and Comparative Examples 1-7 which will be hereinafter described, the concentrations of ammonia and nitric acid in the fine silver particle dispersing solution, and the amount of heptanoic acid with respect to silver were the same values (0.4% by weight, 1.0% by weight and 5% by weight, respectively).

The pH of the fine silver particle dispersing solution was measured by means of a pH meter (handy pH/Do meter D-55 produced by Horiba Ltd.) (based on the pH measuring method described in JIS Z8802 (1984)). As a result, the pH was 5.84. Furthermore, before the measurement of the pH, the 2-point calibration was carried out with standard solutions having a pH of 6.86 and a pH of 4.01, respectively. After the fine silver particle dispersing solution was sufficiently stirred, it was allowed to stand for about 30 seconds to about minute. Then, the pH electrode (9611-10D produced by Horiba Ltd.) serving as an inspection end was dipped in the fine silver particle dispersing solution to carry out the measurement of the pH.

The viscosity of the fine silver particle dispersing solution was measured at 11.7 (1/s), 108 (1/s) and 1000 (1/s), respectively, by means of a rheometer (Reostress 600C produced by HAAKE, Cone: C35/2). As a result, the viscosity was 383 mPa·s, 143 mPa·s and 102 mPa·s, respectively. The thixotropic ratio (TR) (=viscosity at 11.7 (1/s)/viscosity at 1000 (1/s)) of the fine silver particle dispersing solution was 4. The lamella length of the fine silver particle dispersing solution was measured by means of an automatic surface tension balance (DY-300 produced by Kyowa Interface Science Co., Ltd.) using a platinum ring having a wire diameter of 0.40 mm and a ring diameter of 14.4 mm as a lamella length probe, at a stage vertical speed of 1.0 mm/sec, a pre-wet stage vertical speed of 1.0 mm/sec and a pre-wet dipping distance of 2.50 mm for a pre-wet dipping time of 5 seconds. As a result, the average value of six measured values was 4.5 mm (standard deviation (SD)=0.15, coefficient of variation (CV)=3.4%).

Then, a simple flexographic printing machine (Flexoloop 100 produced by RK Print Coat Instruments Ltd.) and a flexographic printing plate (produced by Watanabe Gosando Co., Ltd., Material of Printing Plate: Photosensitive Resin Plate AWP produced by Asahi Kasei Corporation, Grade DEF, Surface Processing 150 lines, 96 DOT %) were used for applying the above-described fine silver particle dispersing solution on a substrate of a paper (DF Color M70 commercially available from Mitsubishi Paper Mills Limited, Surface Roughness=1.6 μm) at an anilox volume of 20 cc/m$^2$ (150 lines/inch) and at a printing speed of 20 m/min. (in a printing direction shown by arrow B) by moving the substrate (in a direction shown by arrow A) so as to form a coating film having the shape and size shown in FIG. 1A (a coating film having a line width of 0.5 mm and being turned at a space of 0.5 mm in width directions, in an area having a length of 30 mm×a width of 9.5 mm).

After the fine silver particle dispersing solution was thus applied, the lengths L of the thin web-shaped films (of the fine silver particle dispersing solution) formed in shaded areas shown in FIG. 1B were measured to obtain an average value thereof. As a result, the average value of the lengths L was 1.9 mm.

Figure 2:
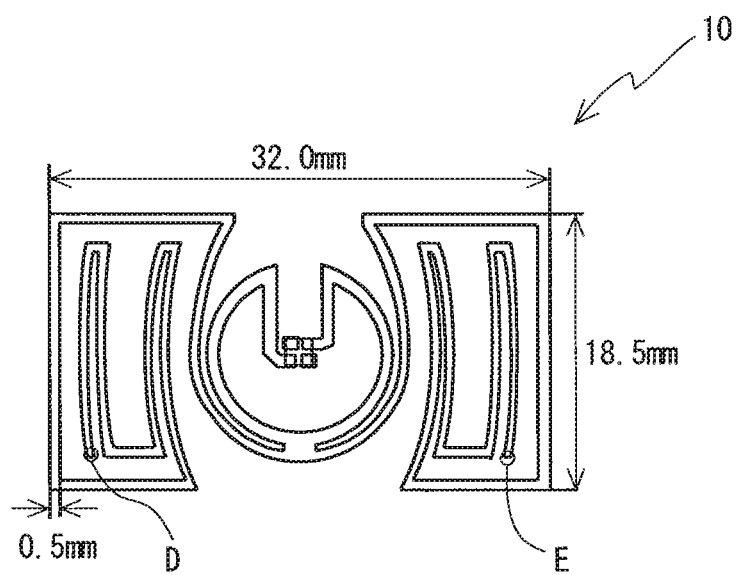
FIG. 2 is a plan view showing the shape of an RFID antenna produced in examples and comparative examples.

After the above-described fine silver particle solution was printed in the shape shown in FIG. 2 (in the shape of an RFID antenna 10 having a total length of 32.0 mm, a total width of 18.5 mm and a line width of 0.5 mm) by the same method as the above-described method, it was heat-treated at 140° C., for 30 seconds on a hot plate to be burned to produce an RFID antenna of a silver conductive film.

The thickness and electrical resistance (line resistance) of the silver conductive film were measured, and the volume resistivity of the silver conductive film was calculated.

The thickness of the silver conductive film was obtained by calculating an average value of height differences between the surface of the conductive film and the surface of the substrate having the conductive film, the height differences being measured at 100 spots by means of a laser microscope (VK-9700 produced by KEYENCE CORPORATION). As a result, the thickness of the conductive film was 2.0 μm.

The line resistance (the electrical resistance between D and E shown in FIG. 2) of the conductive film was measured by means of a tester (CDM-03D produced by CUSTOM CORPORATION). As a result, the electrical resistance of the conductive film was 33Ω.

The volume resistivity of the conductive film was obtained from the thickness, width (0.5 mm), length (237.4 mm) and electrical resistance of the conductive film. As a result, the volume resistivity of the silver conductive film was 14.0 μΩ·cm.

Example 2

A fine silver particle dispersing solution containing 59.4% by weight of fine silver particles was produced by the same method as that in Example 1, except that a silicone antifoaming agent (KM-7750 commercially available from Shin-Etsu Chemical Co., Ltd.) was used in place of the surface regulating agent, that the amount of the silicone antifoaming agent to be added was 0.02 g (0.01% by weight with respect to the Ag ink) and that the amount of the supernatant liquid to be added was 5.35 g, the supernatant liquid being obtained before the adjustment of the pH. Then, by the same methods as those in Example 1, the pH, viscosity and lamella length of the fine silver particle dispersing solution were measured. As a result, the pH of the fine silver particle dispersing solution was 5.85. The viscosity of the fine silver particle dispersing solution was 295 mPa·s at 11.7 (1/s), 129 mPa·s at 108 (1/s) and 80 mPa·s at 1000 (1/s). The thixotropic ratio of the fine silver particle dispersing solution was 4. The average value of the six measured values of the lamella length was 1.1 mm (standard deviation=0.12, coefficient of variation=10.5%). By the same methods as those in Example 1, the fine silver particle solution was applied to measure the length L of a thin web-shaped film. As a result, the average value thereof was 0 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.3 μm, and the line resistance thereof was 29Ω. The volume resistivity of the silver conductive film was 13.9 μΩ·cm.

Example 3

A fine silver particle dispersing solution was produced by the same method as that in Example 2, except that the amount of the antifoaming agent to be added was 0.04 g (0.02% by weight with respect to the Ag ink) and that the amount of the supernatant liquid to be added was 5.35 g, the supernatant liquid being obtained before the adjustment of the pH. Then, by the same methods as those in Example 2, the pH, viscosity and lamella length of the fine silver particle dispersing solution were measured. As a result, the pH of the fine silver particle dispersing solution was 5.85. The viscosity of the fine silver particle dispersing solution was 358 mPa·s at 11.7 (1/s), 169 mPa·s at 108 (1/s) and 104 mPa·s at 1000 (1/s). The thixotropic ratio of the fine silver particle dispersing solution was 3. The average value of the six measured values of the lamella length was 1.0 mm (standard deviation=0.07, coefficient of variation=6.9%). By the same methods as those in Example 1, the fine silver particle solution was applied to measure the length L of a thin web-shaped film. As a result, the average value thereof was 0 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.3 μm, and the line resistance thereof was 29Ω. The volume resistivity of the silver conductive film was 14.1 μΩ·cm.

Example 4

A fine silver particle dispersing solution was produced by the same method as that in Example 2, except that the amount of the antifoaming agent to be added was 0.41 g (0.20% by weight with respect to the Ag ink) and that the amount of the supernatant liquid to be added was 4.98 g, the supernatant liquid being obtained before the adjustment of the pH. Then, by the same methods as those in Example 2, the pH, viscosity and lamella length of the fine silver particle dispersing solution were measured. As a result, the pH of the fine silver particle dispersing solution was 5.85. The viscosity of the fine silver particle dispersing solution was 358 mPa·s at 11.7 (1/s), 169 mPa·s at 108 (1/s) and 105 mPa·s at 1000 (1/s). The thixotropic ratio of the fine silver particle dispersing solution was 3. The average value of the six measured values of the lamella length was 0.9 mm (standard deviation=0.11, coefficient of variation=13.0%). By the same methods as those in Example 1, the fine silver particle solution was applied to measure the length L of a thin web-shaped film. As a result, the average value thereof was 0 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.3 μm, and the line resistance thereof was 30Ω. The volume resistivity of the silver conductive film was 14.4 μΩ·cm.

Example 5

A fine silver particle dispersing solution was produced by the same method as that in Example 1, except that a silicone antifoaming agent (KM-90 commercially available from Shin-Etsu Chemical Co., Ltd.) was used in place of the surface regulating agent, that the amount of the silicone antifoaming agent to be added was 0.02 g (0.01% by weight with respect to the Ag ink) and that the amount of the supernatant liquid to be added was 5.35 g, the supernatant liquid being obtained before the adjustment of the pH. Then, by the same methods as those in Example 1, the pH, viscosity and lamella length of the fine silver particle dispersing solution were measured. As a result, the pH of the fine silver particle dispersing solution was 5.85. The viscosity of the fine silver particle dispersing solution was 311 mPa·s at 11.7 (1/s), 134 mPa·s at 108 (1/s) and 82 mPa·s at 1000 (1/s). The thixotropic ratio of the fine silver particle dispersing solution was 4. The average value of the six measured values of the lamella length was 1.3 mm (standard deviation=0.18, coefficient of variation=14.0%). By the same methods as those in Example 1, the fine silver particle solution was applied to measure the length L of a thin web-shaped film. As a result, the average value thereof was 0 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.1 μm, and the line resistance thereof was 31Ω. The volume resistivity of the silver conductive film was 13.8 μΩ·cm.

Example 6

A fine silver particle dispersing solution was produced by the same method as that in Example 5, except that the amount of the antifoaming agent to be added was 0.04 g (0.02% by weight with respect to the Ag ink) and that the amount of the supernatant liquid to be added was 5.35 g, the supernatant liquid being obtained before the adjustment of the pH. Then, by the same methods as those in Example 5, the pH, viscosity and lamella length of the fine silver particle dispersing solution were measured. As a result, the pH of the fine silver particle dispersing solution was 5.85. The viscosity of the fine silver particle dispersing solution was 340 mPa·s at 11.7 (1/s), 164 mPa·s at 108 (1/s) and 103 mPa·s at 1000 (1/s). The thixotropic ratio of the fine silver particle dispersing solution was 3. The average value of the six measured values of the lamella length was 1.3 mm (standard deviation=0.13, coefficient of variation=9.9%). By the same methods as those in Example 1, the fine silver particle solution was applied to measure the length L of a thin web-shaped film. As a result, the average value thereof was 0 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 1.8 μm, and the line resistance thereof was 35Ω. The volume resistivity of the silver conductive film was 13.6 μΩ·cm.

Example 7

A fine silver particle dispersing solution was produced by the same method as that in Example 5, except that the amount of the antifoaming agent to be added was 0.41 g (0.20% by weight with respect to the Ag ink) and that the amount of the supernatant liquid to be added was 4.98 g, the supernatant liquid being obtained before the adjustment of the pH. Then, by the same methods as those in Example 5, the pH, viscosity and lamella length of the fine silver particle dispersing solution were measured. As a result, the pH of the fine silver particle dispersing solution was 5.85. The viscosity of the fine silver particle dispersing solution was 308 mPa·s at 11.7 (1/s), 163 mPa·s at 108 (1/s) and 108 mPa·s at 1000 (1/s). The thixotropic ratio of the fine silver particle dispersing solution was 3. The average value of the six measured values of the lamella length was 1.0 mm (standard deviation=0.10, coefficient of variation=9.6%). By the same methods as those in Example 1, the fine silver particle solution was applied to measure the length L of a thin web-shaped film. As a result, the average value thereof was 0 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 1.9 μm, and the line resistance thereof was 33Ω. The volume resistivity of the silver conductive film was 13.4 μΩ·cm.

Comparative Example 1

A fine silver particle dispersing solution was produced by the same method as that in Example 1, except that the surface regulating agent was not added and that the amount of the supernatant liquid to be added was 5.39 g, the supernatant liquid being obtained before the adjustment of the pH. Then, by the same methods as those in Example 1, the pH, viscosity and lamella length of the fine silver particle dispersing solution were measured. As a result, the pH of the fine silver particle dispersing solution was 5.85. The viscosity of the fine silver particle dispersing solution was 420 mPa·s at 11.7 (1/s), 191 mPa·s at 108 (1/s) and 112 mPa·s at 1000 (1/s). The thixotropic ratio of the fine silver particle dispersing solution was 4. The average value of the six measured values of the lamella length was 5.3 mm (standard deviation=0.08, coefficient of variation=1.6%). By the same methods as those in Example 1, the fine silver particle solution was applied to measure the length L of a thin web-shaped film. As a result, the average value thereof was 25 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.1 μm, and the line resistance thereof was 33Ω. The volume resistivity of the silver conductive film was 14.8 μΩ·cm.

Example 8

A fine silver particle dispersing solution was produced by the same method as that in Example 1, except that a surface regulating agent (BYK331 commercially available from BYK Limited) (containing 98% by weight or more of non-volatile components and having a middle surface-tension deteriorating ability) comprising a mixture of a polyether-modified polydimethylsiloxane and a polyether was used as the surface regulating agent, that the amount of the surface regulating agent to be added was 0.41 g (0.20% by weight with respect to the Ag ink) and that the amount of the supernatant liquid to be added was 4.98 g, the supernatant liquid being obtained before the adjustment of the pH. Then, by the same methods as those in Example 1, the pH, viscosity and lamella length of the fine silver particle dispersing solution were measured. As a result, the pH of the fine silver particle dispersing solution was 5.83. The viscosity of the fine silver particle dispersing solution was 384 mPa·s at 11.7 (1/s), 155 mPa·s at 108 (1/s) and 111 mPa·s at 1000 (1/s). The thixotropic ratio of the fine silver particle dispersing solution was 3. The average value of the six measured values of the lamella length was 4.6 mm (standard deviation=0.12, coefficient of variation=2.6%). By the same methods as those in Example 1, the fine silver particle solution was applied to measure the length L of a thin web-shaped film. As a result, the average value thereof was 2.2 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.2 μm, and the line resistance thereof was 34Ω. The volume resistivity of the silver conductive film was 15.4 μΩ·cm.

Example 9

A fine silver particle dispersing solution was produced by the same method as that in Example 8, except that the amount of the surface regulating agent to be added was 0.62 g (0.30% by weight with respect to the Ag ink) and that the amount of the supernatant liquid to be added was 4.77 g, the supernatant liquid being obtained before the adjustment of the pH. Then, by the same methods as those in Example 8, the pH, viscosity and lamella length of the fine silver particle dispersing solution were measured. As a result, the pH of the fine silver particle dispersing solution was 5.85. The viscosity of the fine silver particle dispersing solution was 737 mPa·s at 11.7 (1/s), 341 mPa·s at 108 (1/s) and 200 mPa·s at 1000 (1/s). The thixotropic ratio of the fine silver particle dispersing solution was 4. The average value of the six measured values of the lamella length was 4.5 mm (standard deviation=0.09, coefficient of variation=2.1%). By the same methods as those in Example 1, the fine silver particle solution was applied to measure the length L of a thin web-shaped film. As a result, the average value thereof was 4.2 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.1 μm, and the line resistance thereof was 33Ω. The volume resistivity of the silver conductive film was 14.4 μΩ·cm.

Example 10

A fine silver particle dispersing solution was produced by the same method as that in Example 8, except that the amount of the surface regulating agent to be added was 1.03 g (0.50% by weight with respect to the Ag ink) and that the amount of the supernatant liquid to be added was 4.36 g, the supernatant liquid being obtained before the adjustment of the pH. Then, by the same methods as those in Example 8, the pH, viscosity and lamella length of the fine silver particle dispersing solution were measured. As a result, the pH of the fine silver particle dispersing solution was 5.85. The viscosity of the fine silver particle dispersing solution was 5434 mPa·s at 11.7 (1/s), 894 mPa·s at 108 (1/s) and 269 mPa·s at 1000 (1/s). The thixotropic ratio of the fine silver particle dispersing solution was 20. The average value of the six measured values of the lamella length was 4.5 mm (standard deviation=0.10, coefficient of variation=2.3%). By the same methods as those in Example 1, the fine silver particle solution was applied to measure the length L of a thin web-shaped film. As a result, the average value thereof was 3.0 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.0 µm, and the line resistance thereof was 34Ω. The volume resistivity of the silver conductive film was 14.0 µΩ·cm.

Comparative Example 2

A fine silver particle dispersing solution was produced by the same method as that in Example 8, except that the amount of the surface regulating agent to be added was 0.10 g (0.05% by weight with respect to the Ag ink) and that the amount of the supernatant liquid to be added was 5.28 g, the supernatant liquid being obtained before the adjustment of the pH. Then, by the same methods as those in Example 8, the pH, viscosity and lamella length of the fine silver particle dispersing solution were measured. As a result, the pH of the fine silver particle dispersing solution was 5.85. The viscosity of the fine silver particle dispersing solution was 312 mPa·s at 11.7 (1/s), 158 mPa·s at 108 (1/s) and 103 mPa·s at 1000 (1/s). The thixotropic ratio of the fine silver particle dispersing solution was 3. The average value of the six measured values of the lamella length was 4.9 mm (standard deviation=0.15, coefficient of variation=3.1%). By the same methods as those in Example 1, the fine silver particle solution was applied to measure the length L of a thin web-shaped film. As a result, the average value thereof was 17 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.1 µm, and the line resistance thereof was 33Ω. The volume resistivity of the silver conductive film was 14.7 µΩ·cm.

Comparative Example 3

A fine silver particle dispersing solution was produced by the same method as that in Example 8, except that the amount of the surface regulating agent to be added was 0.21 g (0.10% by weight with respect to the Ag ink) and that the amount of the supernatant liquid to be added was 5.18 g, the supernatant liquid being obtained before the adjustment of the pH. Then, by the same methods as those in Example 8, the pH, viscosity and lamella length of the fine silver particle dispersing solution were measured. As a result, the pH of the fine silver particle dispersing solution was 5.85. The viscosity of the fine silver particle dispersing solution was 312 mPa·s at 11.7 (1/s), 171 mPa·s at 108 (1/s) and 116 mPa·s at 1000 (1/s). The thixotropic ratio of the fine silver particle dispersing solution was 3. The average value of the six measured values of the lamella length was 4.8 mm (standard deviation=0.06, coefficient of variation=1.3%). By the same methods as those in Example 1, the fine silver particle solution was applied to measure the length L of a thin web-shaped film. As a result, the average value thereof was 10 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.1 µm, and the line resistance thereof was 33Ω. The volume resistivity of the silver conductive film was 14.1 µΩ·cm.

Comparative Example 4

A fine silver particle dispersing solution was produced by the same method as that in Example 8, except that the amount of the surface regulating agent to be added was 1.54 g (0.75% by weight with respect to the Ag ink) and that the amount of the supernatant liquid to be added was 3.85 g, the supernatant liquid being obtained before the adjustment of the pH. Then, by the same methods as those in Example 8, the pH, viscosity and lamella length of the fine silver particle dispersing solution were measured. As a result, the pH of the fine silver particle dispersing solution was 5.85. The viscosity of the fine silver particle dispersing solution was 3094 mPa·s at 11.7 (1/s), 1891 mPa·s at 108 (1/s) and 335 mPa·s at 1000 (1/s). Thus, the viscosity was very high. The thixotropic ratio of the fine silver particle dispersing solution was 92. It was not possible to measure the lamella length since the viscosity was too high. By the same methods as those in Example 1, the fine silver particle solution was applied to measure the length L of a thin web-shaped film. As a result, the average value thereof was 2.7 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.1 µm, and the line resistance thereof was 30Ω. The volume resistivity of the silver conductive film was 13.3 µΩ·cm.

Example 11

A fine silver particle dispersing solution was produced by the same method as that in Example 1, except that a surface regulating agent (BYK333 commercially available from BYK Limited) (containing 97% by weight or more of non-volatile components and having a high surface-tension deteriorating ability) comprising a mixture of a polyether-modified polydimethylsiloxane and a polyether was used as the surface regulating agent, that the amount of the surface regulating agent to be added was 0.62 g (0.30% by weight with respect to the Ag ink) and that the amount of the supernatant liquid to be added was 4.77 g, the supernatant liquid being obtained before the adjustment of the pH. Then, by the same methods as those in Example 1, the pH, viscosity and lamella length of the fine silver particle dispersing solution were measured. As a result, the pH of the fine silver particle dispersing solution was 5.83. The viscosity of the fine silver particle dispersing solution was 392 mPa·s at 11.7 (1/s), 167 mPa·s at 108 (1/s) and 115 mPa·s at 1000 (1/s). The thixotropic ratio of the fine silver particle dispersing solution was 3. The average value of the six measured values of the lamella length was 3.2 mm (standard deviation 0.40, coefficient of variation=12.5%). By the same methods as those in Example 1, the fine silver particle solution was applied to measure the length L of a thin web-shaped film. As a result, the average value thereof was 0 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.2 μm, and the line resistance thereof was 34Ω. The volume resistivity of the silver conductive film was 15.9 μΩ·cm.

Example 12

A fine silver particle dispersing solution was produced by the same method as that in Example 11, except that the amount of the surface regulating agent to be added was 1.03 g (0.50% by weight with respect to the Ag ink) and that the amount of the supernatant liquid to be added was 4.36 g, the supernatant liquid being obtained before the adjustment of the pH. Then, by the same methods as those in Example 11, the pH, viscosity and lamella length of the fine silver particle dispersing solution were measured. As a result, the pH of the fine silver particle dispersing solution was 5.85. The viscosity of the fine silver particle dispersing solution was 1593 mPa·s at 11.7 (1/s), 397 mPa·s at 108 (1/s) and 182 mPa·s at 1000 (1/s). The thixotropic ratio of the fine silver particle dispersing solution was 9. The average value of the six measured values of the lamella length was 1.9 mm (standard deviation=0.09, coefficient of variation=4.6%). By the same methods as those in Example 1, the fine silver particle solution was applied to measure the length L of a thin web-shaped film. As a result, the average value thereof was 0 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.4 μm, and the line resistance thereof was 31Ω. The volume resistivity of the silver conductive film was 15.6 μΩ·cm.

Comparative Example 5

A fine silver particle dispersing solution was produced by the same method as that in Example 11, except that the amount of the surface regulating agent to be added was 1.54 g (0.75% by weight with respect to the Ag ink) and that the amount of the supernatant liquid to be added was 3.85 g, the supernatant liquid being obtained before the adjustment of the pH. Then, by the same methods as those in Example 11, the pH, viscosity and lamella length of the fine silver particle dispersing solution were measured. As a result, the pH of the fine silver particle dispersing solution was 5.85. The viscosity of the fine silver particle dispersing solution was 18240 mPa·s at 11.7 (1/s), 2041 mPa·s at 108 (1/s) and 329 mPa·s at 1000 (1/s). Thus, the viscosity was very high. The thixotropic ratio of the fine silver particle dispersing solution was 55. It was not possible to measure the lamella length since the viscosity was too high. By the same methods as those in Example 1, the fine silver particle solution was applied to measure the length L of a thin web-shaped film. As a result, the average value thereof was 0 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.1 μm, and the line resistance thereof was 31Ω. The volume resistivity of the silver conductive film was 13.9 μΩ·cm.

Comparative Example 6

A fine silver particle dispersing solution was produced by the same method as that in Example 1, except that a surface regulating agent (BYK348 commercially available from BYK Limited) (containing 96% by weight or more of non-volatile components and having a high surface-tension deteriorating ability) comprising 76% by weight of a polyether-modified polydimethylsiloxane and 24% by weight of a polyglycol was used as the surface regulating agent, that the amount of the surface regulating agent to be added was 0.41 g (0.20% by weight with respect to the Ag ink) and that the amount of the supernatant liquid to be added was 4.98 g, the supernatant liquid being obtained before the adjustment of the pH. Then, by the same methods as those in Example 1, the pH, viscosity and lamella length of the fine silver particle dispersing solution were measured. As a result, the pH of the fine silver particle dispersing solution was 5.84. The viscosity of the fine silver particle dispersing solution was 347 mPa·s at 11.7 (1/s), 127 mPa·s at 108 (1/s) and 96 mPa·s at 1000 (1/s). The thixotropic ratio of the fine silver particle dispersing solution was 4. The average value of the six measured values of the lamella length was 5.1 mm (standard deviation=0.16, coefficient of variation=3.2%). By the same methods as those in Example 1, the fine silver particle solution was applied to measure the length L of a thin web-shaped film. As a result, the average value thereof was 26 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 2.0 μm, and the line resistance thereof was 33Ω. The volume resistivity of the silver conductive film was 13.9 μΩ·cm.

Comparative Example 7

A fine silver particle dispersing solution was produced by the same method as that in Example 1, except that a surface regulating agent (BYK349 commercially available from BYK Limited) (containing 94% by weight or more of non-volatile components and having a high surface-tension deteriorating ability) comprising 85% by weight of a polyether-modified polydimethylsiloxane and 15% by weight of a polyglycol was used as the surface regulating agent, that the amount of the surface regulating agent to be added was 0.41 g (0.20% by weight with respect to the Ag ink) and that the amount of the supernatant liquid to be added was 4.98 g, the supernatant liquid being obtained before the adjustment of the pH. Then, by the same methods as those in Example 1, the pH, viscosity and lamella length of the fine silver particle dispersing solution were measured. As a result, the pH of the fine silver particle dispersing solution was 5.84. The viscosity of the fine silver particle dispersing solution was 347 mPa·s at 11.7 (1/s), 133 mPa·s at 108 (1/s) and 94 mPa·s at 1000 (1/s). The thixotropic ratio of the fine silver particle dispersing solution was 4. The average value of the six measured values of the lamella length was 4.9 mm (standard deviation=0.10, coefficient of variation=2.1%). By the same methods as those in Example 1, the fine silver particle solution was applied to measure the length L of a thin web-shaped film. As a result, the average value thereof was 24 mm.

By the same methods as those in Example 1, the fine silver particle dispersing solution was used for producing an RFID antenna of a silver conductive film to measure the thickness and electrical resistance (line resistance) of the silver conductive film, and to calculate the volume resistivity of the silver conductive film. As a result, the thickness of the silver conductive film was 1.9 µm, and the line resistance thereof was 34Ω. The volume resistivity of the silver conductive film was 13.9 µΩ·cm.

Tables 1-3 show the compositions and characteristics of the fine silver particle dispersing solutions in the examples and comparative examples, and the characteristics of silver conductive films produced by using the fine silver particle solutions.

TABLE 1

|  | Shape Retaining Agent | Amount to be added (% by weight) |
|---|---|---|
| Ex. 1 | Polyether-modified polydimethylsiloxane, polyoxyethylene alkyl ether | 0.20 |
| Ex. 2 | silicone antifoaming agent | 0.01 |
| Ex. 3 | silicone antifoaming agent | 0.02 |
| Ex. 4 | silicone antifoaming agent | 0.20 |
| Ex. 5 | silicone antifoaming agent | 0.01 |
| Ex. 6 | silicone antifoaming agent | 0.02 |
| Ex. 7 | silicone antifoaming agent | 0.20 |
| Comp. 1 | — | 0 |
| Ex. 8 | mixture of polyether-modified polydimethylsiloxane and polyether | 0.20 |
| Ex. 9 | mixture of polyether-modified polydimethylsiloxane and polyether | 0.30 |
| Ex. 10 | mixture of polyether-modified polydimethylsiloxane and polyether | 0.50 |
| Comp. 2 | mixture of polyether-modified polydimethylsiloxane and polyether | 0.05 |
| Comp. 3 | mixture of polyether-modified polydimethylsiloxane and polyether | 0.10 |
| Comp. 4 | mixture of polyether-modified polydimethylsiloxane and polyether | 0.75 |
| Ex. 11 | mixture of polyether-modified polydimethylsiloxane and polyether | 0.30 |
| Ex. 12 | mixture of polyether-modified polydimethylsiloxane and polyether | 0.50 |
| Comp. 5 | mixture of polyether-modified polydimethylsiloxane and Polyether | 0.75 |
| Comp. 6 | polyether-modified polydimethylsiloxane, polyglycol | 0.20 |
| Comp. 7 | polyether-modified siloxane, polyether | 0.20 |

TABLE 2

|  | Viscosity (mPa·s) | | | | Lamella Length | | | Length of Web-shaped Film (mm) |
|---|---|---|---|---|---|---|---|---|
|  | 11.7 (1/s) | 108 (1/s) | 1000 (1/s) | TR | av. (mm) | SD | CV (%) | |
| Ex. 1 | 383 | 143 | 102 | 4 | 4.5 | 0.15 | 3.4 | 1.9 |
| Ex. 2 | 295 | 129 | 80 | 4 | 1.1 | 0.12 | 10.5 | 0 |
| Ex. 3 | 358 | 169 | 104 | 3 | 1.0 | 0.07 | 6.9 | 0 |
| Ex. 4 | 358 | 169 | 105 | 3 | 0.9 | 0.11 | 13.0 | 0 |
| Ex. 5 | 311 | 134 | 82 | 4 | 1.3 | 0.18 | 14.0 | 0 |
| Ex. 6 | 340 | 164 | 103 | 3 | 1.3 | 0.13 | 9.9 | 0 |
| Ex. 7 | 308 | 163 | 108 | 3 | 1.0 | 0.10 | 9.6 | 0 |
| Comp. 1 | 420 | 191 | 112 | 4 | 5.3 | 0.08 | 1.6 | 25 |
| Ex. 8 | 384 | 155 | 111 | 3 | 4.6 | 0.12 | 2.6 | 2.2 |
| Ex. 9 | 737 | 341 | 200 | 4 | 4.5 | 0.09 | 2.1 | 4.2 |
| Ex. 10 | 5434 | 894 | 269 | 20 | 4.5 | 0.10 | 2.3 | 3.0 |
| Comp. 2 | 312 | 158 | 103 | 3 | 4.9 | 0.15 | 3.1 | 17 |
| Comp. 3 | 312 | 171 | 116 | 3 | 4.8 | 0.06 | 1.3 | 10 |
| Comp. 4 | 30940 | 1891 | 335 | 92 | — | — | — | 2.7 |
| Ex. 11 | 392 | 167 | 115 | 3 | 3.2 | 0.40 | 12.5 | 0 |
| Ex. 12 | 1593 | 397 | 182 | 9 | 1.9 | 0.09 | 4.6 | 0 |
| Comp. 5 | 18240 | 2041 | 329 | 55 | — | — | — | 0 |
| Comp. 6 | 347 | 127 | 96 | 4 | 5.1 | 0.16 | 3.2 | 26 |
| Comp. 7 | 347 | 133 | 94 | 4 | 4.9 | 0.10 | 2.1 | 24 |

TABLE 3

|  | Line Resistance (Ω) | Thickness of Wire (µm) | Volume Resistivity (Ω·cm) |
|---|---|---|---|
| Ex. 1 | 33 | 2.0 | 14.0 |
| Ex. 2 | 29 | 2.3 | 13.9 |
| Ex. 3 | 29 | 2.3 | 14.1 |
| Ex. 4 | 30 | 2.3 | 14.4 |
| Ex. 5 | 31 | 2.1 | 13.8 |
| Ex. 6 | 35 | 1.8 | 13.6 |
| Ex. 7 | 33 | 1.9 | 13.4 |
| Comp. 1 | 33 | 2.1 | 14.8 |
| Ex. 8 | 34 | 2.2 | 15.4 |
| Ex. 9 | 33 | 2.1 | 14.4 |
| Ex. 10 | 34 | 2.0 | 14.0 |
| Comp. 2 | 33 | 2.1 | 14.7 |
| Comp. 3 | 33 | 2.1 | 14.1 |
| Comp. 4 | 30 | 2.1 | 13.3 |
| Ex. 11 | 34 | 2.2 | 15.9 |
| Ex. 12 | 31 | 2.4 | 15.6 |
| Comp. 5 | 31 | 2.1 | 13.9 |
| Comp. 6 | 33 | 2.0 | 13.9 |
| Comp. 7 | 34 | 1.9 | 13.9 |

The fine silver particle dispersing solution according to the present invention can be applied to printed electronics. For example, it can be used for producing printed CPUs, printed lightings, printed tags, all-printed displays, sensors, printed wiring boards, organic solar cells, electronic books, nanoimprint LEDs, liquid crystal display panels, plasma display panels, printed memories and so forth.

The invention claimed is:

1. A fine silver particle dispersing solution comprising:
a water-based dispersion medium;
fine silver particles dispersed in the water-based dispersion medium, the fine silver particles being coated with an organic acid or a derivative thereof;
ammonia added to the water-based dispersion medium;
nitric acid added to the water-based dispersion medium; and
a surface regulating agent which has a content of 0.15 to 0.6% by weight in said fine silver particle dispersing solution and which contains polyether-modified polydimethyl siloxane and a polyoxyethylene alkyl ether or which is a mixture of polyether-modified polydimethylsiloxane and a polyether, said surface regulating agent being added to the water-based dispersion medium.

2. A fine silver particle dispersing solution as set forth in claim 1, wherein said ammonia has a concentration of 0.1 to 2.0% by weight in said fine silver particle dispersing solution.

3. A fine silver particle dispersing solution as set forth in claim 1, wherein said nitric acid has a concentration of 0.1 to 6.0% by weight in said fine silver particle dispersing solution.

4. A fine silver particle dispersing solution as set forth in claim 1, which has a pH of 5.3 to 8.0.

5. A fine silver particle dispersing solution as set forth in claim 1, wherein said water-based dispersion medium is a solvent containing 50% by weight or more of water.

6. A fine silver particle dispersing solution as set forth in claim 1, wherein said fine silver particles have a content of 30 to 75% by weight in said fine silver particle dispersing solution.

7. A fine silver particle dispersing solution as set forth in claim 1, wherein said fine silver particles have an average particle diameter of 1 to 100 nm.

8. A fine silver particle dispersing solution as set forth in claim 1, wherein said organic acid is a carboxylic acid having a carbon number of 5 to 8.

9. A fine silver particle dispersing solution as set forth in claim 1, wherein said organic acid or derivative thereof has an amount of 2 to 20% by weight with respect to silver in said fine silver particle dispersing solution.

10. A fine silver particle dispersing solution as set forth in claim 1, which has a lamella length having an average value of 4.6 mm or less.

11. A fine silver particle dispersing solution comprising:
a water-based dispersion medium;
fine silver particles dispersed in the water-based dispersion medium, the fine silver particles being coated with an organic acid or a derivative thereof;
ammonia added to the water-based dispersion medium;
nitric acid added to the water-based dispersion medium; and
a silicon antifoaming agent which has a content of 0.01 to 0.6% by weight in said fine silver particle dispersing solution, said silicon antifoaming agent being added to the water-based dispersion medium.

12. A fine silver particle dispersing solution as set forth in claim 11, wherein said ammonia has a concentration of 0.1 to 2.0% by weight in said fine silver particle dispersing solution.

13. A fine silver particle dispersing solution as set forth in claim 11, wherein said nitric acid has a concentration of 0.1 to 6.0% by weight in said fine silver particle dispersing solution.

14. A fine silver particle dispersing solution as set forth in claim 11, which has a pH of 5.3 to 8.0.

15. A fine silver particle dispersing solution as set forth in claim 11, wherein said water-based dispersion medium is a solvent containing 50% by weight or more of water.

16. A fine silver particle dispersing solution as set forth in claim 11, wherein said fine silver particles have a content of 30 to 75% by weight in said fine silver particle dispersing solution.

17. A fine silver particle dispersing solution as set forth in claim 11, wherein said fine silver particles have an average particle diameter of 1 to 100 nm.

18. A fine silver particle dispersing solution as set forth in claim 11, wherein said organic acid is a carboxylic acid having a carbon number of 5 to 8.

19. A fine silver particle dispersing solution as set forth in claim 11, wherein said organic acid or derivative thereof has an amount of 2 to 20% by weight with respect to silver in said fine silver particle dispersing solution.

20. A fine silver particle dispersing solution as set forth in claim 11, which has a lamella length having an average value of 4.6 mm or less.

* * * * *